(12) United States Patent
Pesucci et al.

(10) Patent No.: US 7,504,892 B1
(45) Date of Patent: Mar. 17, 2009

(54) CHARGE-PUMP FOR PHASE-LOCKED LOOP

(75) Inventors: Alessandro Pesucci, Bereguardo (IT); Shafiq M. Jamal, Gilroy, CA (US)

(73) Assignee: Marvell International Ltd., Hamilton (BM)

( * ) Notice: Subject to any disclaimer, the term of this patent is extended or adjusted under 35 U.S.C. 154(b) by 105 days.

(21) Appl. No.: 11/809,373

(22) Filed: Jun. 1, 2007

(51) Int. Cl.
*H03L 7/00* (2006.01)
(52) U.S. Cl. .............................. 331/16; 331/8; 331/17; 327/157; 327/148; 327/536
(58) Field of Classification Search .................... 331/8, 331/16, 17, 25; 327/148, 156–157, 536
See application file for complete search history.

(56) References Cited

U.S. PATENT DOCUMENTS 6,900,677 B2 * 5/2005 Cho ........................... 327/157
7,250,808 B2 * 7/2007 Yoshimura .................. 327/536

OTHER PUBLICATIONS

IEEE Std 802.11a-1999 (Supplement to IEEE Std 802.11-1999) [Adopted by ISO/IEC and redesignated as ISO/IEC 8802-11: 1999/Amd 1:2000(E)]; Supplement to IEEE Standard for Information technology—Telecommunications and information exchange between systems—Local and metropolitan area networks—Specific requirements—Part 11: Wireless LAN Medium Access Control (MAC) and Physical Layer (PHY) specifications High-speed Physical Layer in the 5 GHz Band; LAN/MAN Standards Committee of the IEEE Computer Society; 91 pages.
IEEE 802.20-PD-06, IEEE P 802.20 V14, Jul. 16, 2004, Draft 802.20 Permanent Document, System Requirements for IEEE 802.20 Mobile Broadband Wireless Access Systems—Version 14, 23 pages.
IEEE Std 802.11b-1999/Cor 1-2001 (Corrigendum to IEEE Std 802.11-1999); IEEE Standard for Information technology—Telecommunications and information exchange between systems—Local and metropolitan area networks—Specific requirements—Part 11: Wireless LAN Medium Access Control (MAC) and Physical Layer (PHY) specifications Amendment 2: Higher-Speed Physical Layer (PHY) extension in the 2.4 GHz Band—Corrigendum 1; LAN/MAN Standards Committee of the IEEE Computer Society; Nov. 7, 2001; 23 pages.

(Continued)

*Primary Examiner*—Anh Q Tran

(57) ABSTRACT

A charge-pump includes a first charge-pump sub-circuit having a control terminal that communicates with a first bias voltage line. A first charge-pump mirror sub-circuit regulates current on the control terminal. A first capacitance and a first ripple reducing sub-circuit communicate with the first bias voltage line. A second charge-pump sub-circuit and a second charge-pump mirror sub-circuit communicate with a second bias voltage line. A second capacitance and a second ripple reducing sub-circuit communicate with the second bias voltage line. An output communicates with the first and second charge-pump sub-circuits.

31 Claims, 6 Drawing Sheets

OTHER PUBLICATIONS

IEEE P802.11g/D8.2, Apr. 2003 (Supplement to ANSI/IEEE Std 802.11-1999(Reaff 2003)); Draft Supplement to Standard [for] Information Technology—Telecommunications and information exchange between systems—Local and metropolitan area networks—Specific requirements—Part 11: Wireless LAN Medium Access Control (MAC) and Physical Layer (PHY) specifications: Further Higher Data Rate Extension in the 2.4 GHz Band; LAN/MAN Standards Committee of the IEEE Computer Society; 69 pages.

IEEE Std 802.11b-1999 (Supplement to IEEE Std 802.11-1999 Edition); Supplement to IEEE Standard for Information technology—Telecommunications and information exchange between systems—Local and metropolitan area networks—Specific requirements—Part 11: Wireless LAN Medium Access Control (MAC) and Physical Layer (PHY) specifications: Higher-Speed Physical Layer Extension in the 2.4 GHz Band; LAN/MAN Standards Committee of the IEEE Computer Society; Sep. 16, 1999 IEEE-SA Standards Board; 96 pages.

IEEE Std 802.16-2004 (Revision of IEEE Std 802.16-2001) IEE Standard for Local and metropolitan area networks; Part 16: Air Interface for Fixed Broadband Wireless Access Systems; IEEE Computer Society and the IEEE Microwave Theory and Techniquest Society; Oct. 1, 2004; 893 pages.

International Standard; ISO/IEC 8802-11; ANSI/IEEE Std 802.11 First edition 1999-00-00; Information technology- Telecommunications and information exchange between systems-Local and metropolitan area networks—Specific requirements—Part 11: Wireless LAN Medium Access Control (MAC) and Physical Layer (PHY) specifications; 531 pages.

802.11n; IEEE P802.11-04/0889r6; Wireless LANs, TGn Sync Proposal Technical Specification; May 2005; 131 pages.

* cited by examiner

CHARGE-PUMP FOR PHASE-LOCKED LOOP

FIELD

The present disclosure relates to a phase-locked loops, and more particularly to a charge-pump circuit for phase-locked loops.

BACKGROUND

The background description provided herein is for the purpose of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

Radio frequency (RF) communications channels are established by wireless communications devices in a wireless network. Receiving devices for high speed data communications channels typically include a phase-locked loop (PLL) circuit that locks onto the phase of a received data stream.

Referring now to FIG. 1, an exemplary PLL 10 includes a phase detector (PD) 12, a charge-pump 14, a loop filter 16, a voltage controlled oscillator (VCO) 18, and a frequency divider 20. The VCO 18 generates an output signal that is divided by the frequency divider 20 and fed back to the PD 12. The PD 12 detects a phase difference between a reference frequency signal 22 (such as the received data stream) and the feedback or divided output signal 24. The PD 12 generally generates UP and DOWN phase difference signals 30, 32. UP signals indicate positive differences between the reference signal and the output signal and DOWN signals represent negative differences.

The charge-pump 14 receives the phase difference signals 30, 32 and generates an output signal that is used to adjust the output of the VCO 18. Performance of the charge-pump 14 is typically characterized by switching speed and phase offset. Phase offset refers to the voltage generated by the charge-pump 14 when the phase of the reference signal 22 and the feedback signal 24 are the same. The phase offset of the charge-pump 14 may be zero.

The output 34 of the charge-pump 14 is filtered by the loop filter 16. The loop filter 16 may include a capacitance-based integrating circuit, although other types of filters may be used. The desired frequency for the output signal 28 of the VCO 18 may be different than the frequency of the reference signal 22. The frequency divider 20 adjusts the frequency of the output signal 28 based on the ratio of the desired output frequency to the reference frequency.

SUMMARY

A charge-pump comprises a first switching driver that outputs a first signal and a first inverted signal based on a first control signal. A second switching driver of the charge-pump outputs a second signal based on a second control signal. A first transistor of a first type comprises a control terminal that communicates with a first voltage bias line, a first terminal, and a second terminal that receives the first signal. A second transistor of the first type comprises a control terminal that communicates with the control terminal of the first transistor of the first type, a first terminal, and a second terminal that receives the first inverted signal.

In other features, a first transistor of a second type comprises a first terminal that communicates with the first terminal of the first transistor of the first type. The first transistor of the second type also comprises a control terminal that communicates with a second voltage bias line and a second terminal that receives the second signal. The control terminal of the first transistor of the first type comprises a gate. The first terminal of the first transistor of the first type comprises a drain. The second terminal of the first transistor of the first type comprises a source.

In other features, the charge-pump comprises an output that communicates with the first terminals of the first transistor of the first type and the first transistor of the second type. The second switching driver outputs a second inverted signal. The charge-pump further comprises a second transistor of the second type that comprises a control terminal that communicates with the control terminal of the first transistor of the second type. The second transistor of the second type also comprises a first terminal and a second terminal that receives the second inverted signal.

In other features, the first signal comprises an up signal and the second signal comprises a down signal. One of the first type and the second type comprises a p-channel metal-oxide semiconductor (PMOS), and the other of the first type and the second type comprises an n-channel metal-oxide semiconductor (NMOS).

In other features, the charge-pump comprises a first capacitance that communicates with the first bias voltage line and a second capacitance that communicates with the second bias voltage line. A reference current source comprises a first terminal that communicates with the first voltage bias line. A first diode-connected transistor comprises a first terminal that communicates with the first terminal of the current reference source. The first diode-connected transistor also comprises a second terminal and a control terminal that communicates with the first terminal and the first voltage bias line.

In other features, the charge-pump comprises a mirror charge-pump sub-circuit that comprises a second diode-connected transistor. The mirror charge-pump circuit also comprises a third transistor of the first type comprising a control terminal that communicates with the first voltage bias line. The third transistor of the first type also comprises a first terminal that communicates with a second terminal of the second diode-connected transistor. The third transistor of the first type also comprises a second terminal that communicates with at least one of a supply potential and a reference potential.

In other features, the mirror charge-pump circuit comprises a third transistor of the second type comprising a control terminal that communicates with the second bias line. The third transistor of the second type comprises a first terminal that communicates with a first terminal of the second diode-connected transistor. The third transistor of the second type also comprises a second terminal that communicates with at least one of the supply potential and the reference potential. The second transistor of the first type attenuates ripple on the first bias voltage line during charge-pump switching.

In other features, a phase-locked loop (PLL) comprises the charge-pump. The PLL further comprises a voltage controlled oscillator (VCO), a frequency divider that receives an output of the VCO, and a phase detector. The phase detector detects a phase difference between a reference frequency signal and an output of the frequency divider and generates the first and second control signals. The charge-pump generates an output signal that adjusts an output signal of the VCO.

In other features, a charge-pump comprises a first switching driver that is responsive to an up control signal and that outputs a first signal and a first inverted signal. The charge-pump also comprises a second switching driver that is responsive to a down control signal and that outputs a second signal and a second inverted signal. A first transistor of a first type comprises a gate that communicates with a first voltage bias line, a drain, and a source that receives the first signal. A second transistor of the first type comprises a gate that communicates with the gate of the first transistor of the first type, a drain, and a source that receives the first inverted signal.

In other features, a first transistor of a second type comprises a drain that communicates with the drain of the first transistor of the first type. The first transistor of the second type also comprises a gate that communicates with a second voltage bias line and a source that receives the second signal. A second transistor of the second type comprises a gate that communicates with the gate of the first transistor of the second type, a drain, and a source that receives the second inverted signal. An output communicates with the first transistor of the first type and the first transistor of the second type. The charge-pump comprises a first capacitance that communicates with the first bias voltage line and a second capacitance that communicates with the second bias voltage line.

In other features, a charge-pump comprises a first charge-pump sub-circuit having a control terminal that communicates with a first bias voltage line. A first charge-pump mirror sub-circuit regulates current on the control terminal. A first capacitance and a first ripple reducing sub-circuit communicate with the first bias voltage line. A second charge-pump sub-circuit and a second charge-pump mirror sub-circuit communicate with a second bias voltage line. A second capacitance and a second ripple reducing sub-circuit communicate with the second bias voltage line. An output communicates with the first and second charge-pump sub-circuits.

In other features, a method for operating a charge-pump comprises outputting a first signal and a first inverted signal from a first switching driver based on a first control signal. The method further comprises outputting a second signal from a second switching driver based on a second control signal. The method further comprises communicating between a control terminal of a first transistor of a first type and a first voltage bias line. The first transistor of the first type comprises a first terminal. The method further comprises receiving the first signal in a second terminal of the first transistor of the first type. The method further comprises communicating between a control terminal of a second transistor of the first type and the control terminal of the first transistor of the first type. The second transistor of the first type also comprises a first terminal.

In other features, the method comprises receiving the first inverted signal in a second terminal of the second transistor of the first type. The method further comprises communicating between a first terminal of a first transistor of a second type and the first terminal of the first transistor of the first type. The method further comprises communicating between a control terminal of the first transistor of the second type and a second voltage bias line. The method further comprises receiving the second signal in a second terminal of the first transistor of the second type. The control terminal of the first transistor of the second type comprises a gate. The first terminal of the first transistor of the first type comprises a drain. The second terminal of the first transistor of the first type comprises a source.

In other features, the method comprises communicating an output with the first terminals of the first transistor of the first type and the first transistor of the second type. The method further comprises outputting a second inverted signal from the second switching driver. The method further comprises communicating between a control terminal of a second transistor of the second type and the control terminal of the first transistor of the second type. The second transistor of the second type comprises a first terminal. The method further comprises receiving the second inverted signal in a second terminal of the second transistor of the second type. The first signal comprises an up signal and the second signal comprises a down signal. One of the first type and the second type comprises a p-channel metal-oxide semiconductor (PMOS) and the other of the first type and the second type comprises an n-channel metal-oxide semiconductor (NMOS).

In other features, the method comprises communicating between a first capacitance and the first bias voltage line and communicating between a second capacitance and the second bias voltage line. The method further comprises communicating between a first terminal of a reference current source and the first voltage bias line. The method further comprises communicating between a first terminal of a first diode-connected transistor and the first terminal of the current reference source. The first diode-connected transistor also comprises a second terminal. The method further comprises communicating between a control terminal of the first diode-connected transistor, the first terminal of the first diode-connected transistor, and the first voltage bias line.

In other features, the method comprises communicating between a control terminal of a third transistor of the first type and the first voltage bias line. The method further comprises communicating between a first terminal of the third transistor of the first type and a second terminal of a second diode-connected transistor. The method further comprises communicating between a second terminal of the third transistor of the first type and at least one of a supply potential and a reference potential. The method further comprises communicating between a control terminal of a third transistor of the second type and the second bias line. The method further comprises communicating between a first terminal of the third transistor of the second type and a first terminal of the second diode-connected transistor. The method further comprises communicating between a second terminal of the third transistor of the second type and at least one of the supply potential and the reference potential. The method further comprises attenuating ripple on the first bias voltage line during charge-pump switching with the second transistor of the first type.

In other features, a method for operating a charge-pump comprises outputting a first signal and a first inverted signal from a first switching driver in response to an up control signal. The method further comprises outputting a second signal and a second inverted signal from a second switching driver in response to a down control signal. The method further comprises communicating between a gate of a first transistor of a first type and a first voltage bias line. The first transistor of the first type comprises a drain. The method further comprises receiving the first signal in a source of the transistor of the first type. The method further comprises communicating between a gate of a second transistor of the first type and the gate of the first transistor of the first type. The second transistor of the first type comprises a drain. The method further comprises receiving the first inverted signal in a source of the second transistor of the first type.

In other features, the method comprises communicating between a drain of a first transistor of a second type and the drain of the first transistor of the first type. The method further comprises communicating between a gate of the first transistor of the second type and a second voltage bias line. The method further comprises receiving the second signal in a source of the first transistor of the second type. The method further comprises communicating between a gate of a second transistor of the second type and the gate of the first transistor of the second type. The second transistor of the second type comprises a drain.

In other features, the method comprises receiving the second inverted signal in a source of the second transistor of the second type. The method further comprises communicating between an output, the first transistor of the first type, and the first transistor of the second type. The method further comprises communicating between a first capacitance and the first bias voltage line. The method further comprises communicating between a second capacitance and the second bias voltage line.

In other features, a method for operating a charge-pump comprises communicating between a control terminal of a first charge-pump sub-circuit and a first bias voltage line. The method further comprises regulating current on the control terminal with a first charge-pump mirror sub-circuit. The method further comprises communicating between a first capacitance and the first bias voltage line. The method further comprises communicating between a first ripple reducing sub-circuit and the first bias voltage line. The method further comprises communicating between a second charge-pump sub-circuit and a second bias voltage line.

In other features, the method comprises communicating between a second charge-pump mirror sub-circuit and the second bias voltage line. The method further comprises communicating between a second capacitance and the second bias voltage line. The method further comprises communicating between a second ripple reducing sub-circuit and the second bias voltage line. The method further comprises communicating between an output and the first and second charge-pump sub-circuits.

In other features, a charge-pump comprises first switching means for switching that outputs a first signal and a first inverted signal based on a first control signal. Second switching means for switching outputs a second signal based on a second control signal. A first transistor of a first type comprises a control terminal that communicates with a first voltage bias line, a first terminal, and a second terminal that receives the first signal.

In other features, a second transistor of the first type comprises a control terminal that communicates with the control terminal of the first transistor of the first type. The second transistor of the first type also comprises a first terminal and a second terminal that receives the first inverted signal. A first transistor of a second type comprises a first terminal that communicates with the first terminal of the first transistor of the first type. The first transistor of the second type also comprises a control terminal that communicates with a second voltage bias line and a second terminal that receives the second signal.

In other features, the control terminal of the first transistor of the first type comprises a gate. The first terminal of the first transistor of the first type comprises a drain. The second terminal of the first transistor of the first type comprises a source. An output communicates with the first terminals of the first transistor of the first type and the first transistor of the second type.

In other features, the second switching means outputs a second inverted signal. The charge pump further comprises a second transistor of the second type that comprises a control terminal that communicates with the control terminal of the first transistor of the second type. The second transistor of the second type also comprises a first terminal and a second terminal that receives the second inverted signal. The first signal comprises an up signal and the second signal comprises a down signal. One of the first type and the second type comprises a p-channel metal-oxide semiconductor (PMOS). The other of the first type and the second type comprises an n-channel metal-oxide semiconductor (NMOS).

In other features, the charge-pump comprises first capacitance means for providing capacitance that communicates with the first bias voltage line. A second capacitance means for providing capacitance communicates with the second bias voltage line. A reference current source comprises a first terminal that communicates with the first voltage bias line. A first diode-connected transistor comprises a first terminal that communicates with the first terminal of the current reference source. The first diode-connected transistor also comprises a second terminal and a control terminal that communicates with the first terminal and the first voltage bias line.

In other features, the charge-pump comprises mirror charge-pump means for controlling charge that comprises a second diode-connected transistor. The mirror charge pump means comprises a third transistor of the first type comprising a control terminal that communicates with the first voltage bias line. The third transistor of the first type also comprises a first terminal that communicates with a second terminal of the second diode-connected transistor. The third transistor of the first type also comprises a second terminal that communicates with at least one of a supply potential and a reference potential.

In other features, the mirror charge pump means comprises a third transistor of the second type comprising a control terminal that communicates with the second bias line. The third transistor of the second type also comprises a first terminal that communicates with a first terminal of the second diode-connected transistor. The third transistor of the second type also comprises a second terminal that communicates with at least one of the supply potential and the reference potential. The second transistor of the first type attenuates ripple on the first bias voltage line during charge-pump switching.

In other features, a phase-locked loop (PLL) comprises the charge-pump and voltage controlled means for oscillating. Dividing means for dividing frequency receives an output of the voltage controlled means. Detecting means for detecting phase difference detects a phase difference between a reference frequency signal and an output of the dividing means and generates the first and second control signals. The charge-pump generates an output signal that adjusts an output signal of the voltage controlled means.

In other features, a charge-pump comprises first switching means for switching that is responsive to an up control signal and that outputs a first signal and a first inverted signal. Second switching means for switching is responsive to a down control signal and outputs a second signal and a second inverted signal. A first transistor of a first type comprises a gate that communicates with a first voltage bias line, a drain, and a source that receives the first signal. A second transistor of the first type comprises a gate that communicates with the gate of the first transistor of the first type, a drain, and a source that receives the first inverted signal.

In other features, a first transistor of a second type comprises a drain that communicates with the drain of the first transistor of the first type. The first transistor of the second type also comprises a gate that communicates with a second voltage bias line and a source that receives the second signal. A second transistor of the second type comprises a gate that communicates with the gate of the first transistor of the second type, a drain, and a source that receives the second inverted signal. Output means for outputting communicates with the first transistor of the first type and the first transistor of the second type.

In other features, the charge-pump comprises first capacitance means for providing capacitance that communicates with the first bias voltage line. Second capacitance means for providing capacitance communicates with the second bias voltage line.

In other features, a charge-pump comprises a first bias voltage line where first charge-pump means for controlling charge has a control terminal that communicates with the first bias voltage line. First charge-pump mirror means for controlling charge regulates current on the control terminal. First capacitance means for providing capacitance communicates with the first bias voltage line. First ripple reducing means for reducing ripple communicates with the first bias voltage line. Second charge-pump means for controlling charge communicates with a second bias voltage line.

In other features, second charge-pump mirror means for controlling charge communicates with the second bias voltage line. Second capacitance means for providing capacitance communicates with the second bias voltage line. Second ripple reducing means for controlling charge communicates with the second bias voltage line. Output means for outputting communicates with the first and second charge-pump means.

Further areas of applicability of the present disclosure will become apparent from the detailed description provided hereinafter. It should be understood that the detailed description and specific examples, while indicating the preferred embodiment of the disclosure, are intended for purposes of illustration only and are not intended to limit the scope of the disclosure.

BRIEF DESCRIPTION OF THE DRAWINGS

The present disclosure will become more fully understood from the detailed description and the accompanying drawings, wherein.

DETAILED DESCRIPTION

Figure 1:
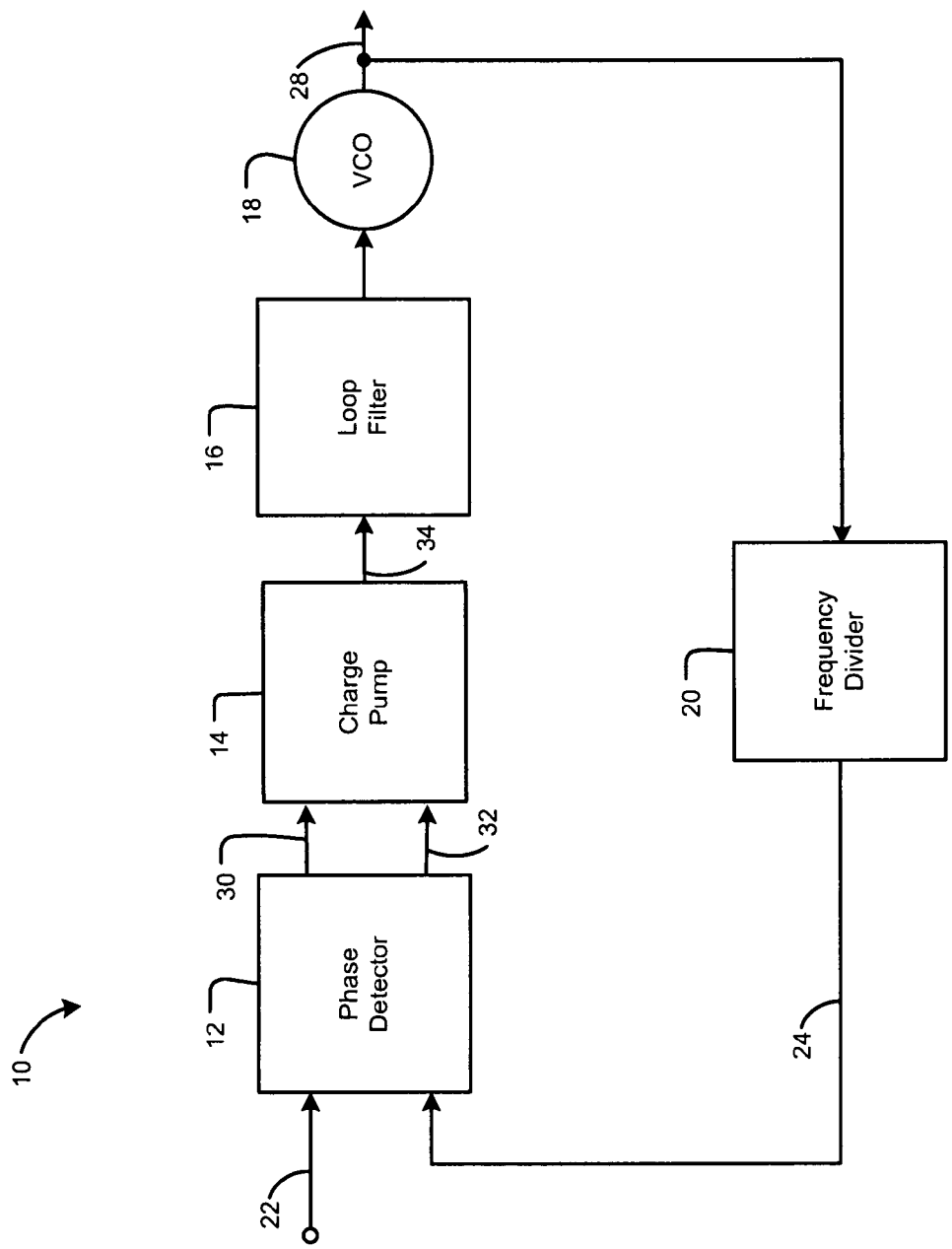
FIG. 1 is a functional block diagram of an exemplary phase-locked loop that includes a charge-pump according to the prior art.

The following description is merely exemplary in nature and is in no way intended to limit the disclosure, its application, or uses. For purposes of clarity, the same reference numbers will be used in the drawings to identify similar elements. As used herein, the term module refers to an Application Specific Integrated Circuit (ASIC), an electronic circuit, a processor (shared, dedicated, or group) and memory that execute one or more software or firmware programs, a combinational logic circuit, and/or other suitable components that provide the described functionality. As used herein, the phrase at least one of A, B, and C should be construed to mean a logical (A or B or C), using a non-exclusive logical or. It should be understood that steps within a method may be executed in different order without altering the principles of the present disclosure.

The present disclosure relates to a charge-pump that includes charge-pump sub-circuits, charge-pump mirror sub-circuits, and ripple reducing charge-pump sub-circuits that have common bias lines. The ripple reducing charge-pump sub-circuits reduce ripple/jitter on the common bias lines, as will be discussed.

Figure 2:
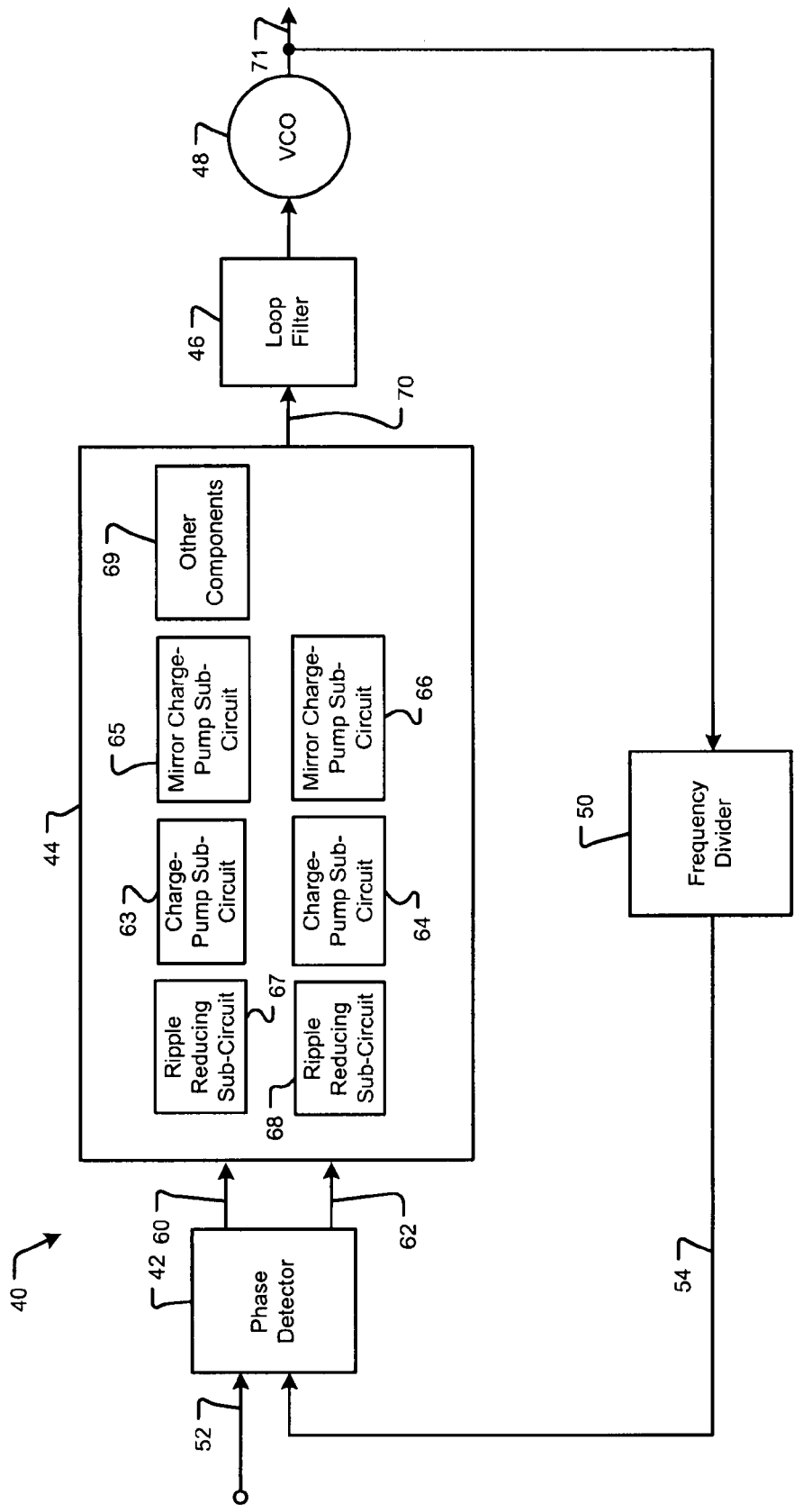
FIG. 2 is a functional block diagram of an exemplary phase-locked loop that includes a charge-pump according to the present disclosure.

Referring now to FIG. 2, an exemplary phase-locked loop (PLL) 40 may include a phase detector (PD) 42, a charge-pump 44, a loop filter 46, a voltage controlled oscillator (VCO) 48, and a frequency divider 50. The VCO 48 generates an output signal that is divided by the frequency divider 50 and fed back to the PD 42. The PD 42 detects a phase difference between a reference frequency signal 52 and the feedback or divided output signal 54. The PD 42 generally generates UP and DOWN phase difference signals 60, 62. The charge-pump 44 may include charge-pump sub-circuits 63, 64, mirror charge-pump sub-circuits 65, 66, ripple reducing sub-circuits 67, 68, and other components 69. The charge-pump 44 may receive the phase difference signals 60, 62. The charge-pump 44 may generate an output 70 that adjusts the output 71 of the VCO 48.

Figure 3:
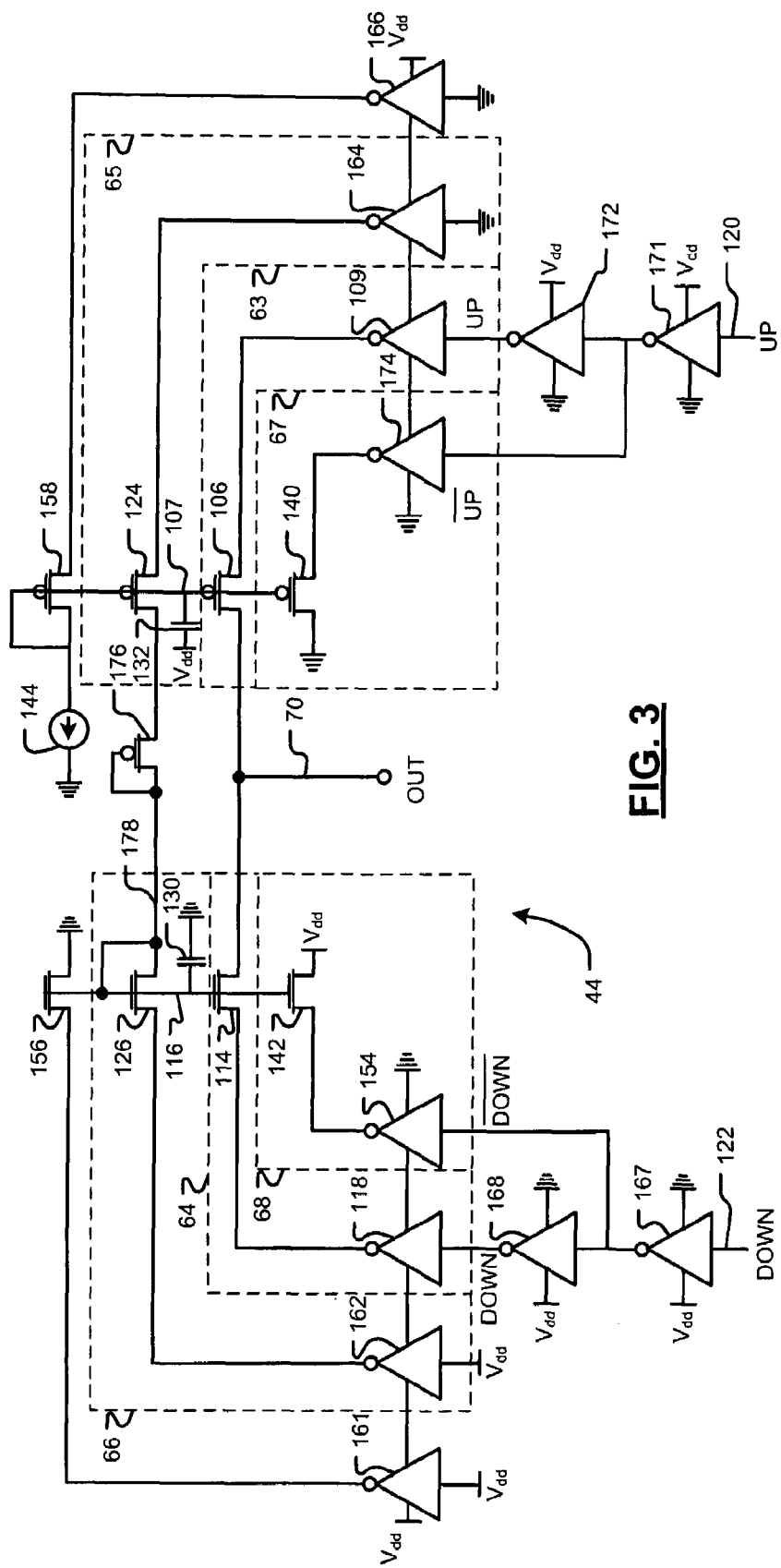
FIG. 3 is a schematic diagram of an exemplary charge-pump that is driven by inverters that are biased by a supply potential and a reference potential according to the present disclosure.

Referring now to FIG. 3, an exemplary charge-pump 44 may include positive and negative charge-pump sub-circuits 63, 64, positive and negative mirror charge-pump sub-circuits 65, 66, and positive and negative ripple reducing sub-circuits 67, 68, in accordance with the present disclosure. A p-channel metal-oxide semiconductor (PMOS) 106 of the positive charge-pump sub-circuit 63 may include a gate or control terminal that communicates with a first low impedance bias voltage line PBIAS 107. The PMOS 106 may also include a drain or first terminal that communicates with an output 70 of the charge-pump and a source or second terminal that communicates with an output of a first inverter 109.

An n-channel metal oxide semiconductor (NMOS) 114 of the negative charge-pump sub-circuit 64 includes a gate that communicates with a second low impedance bias voltage line NBIAS 116. The NMOS 114 may include a drain that communicates with the output 70 of the charge-pump. The NMOS 114 may also include a source that communicates with an output of a second inverter 118. The charge-pump output 70 may represent a current differential between the positive and negative sub-circuits 63, 64 and may register too high or too low. While MOS transistors are shown, various other transistor types can be used without departing from the disclosure. For example, the transistors 106, 114 may be junction transistors.

Signals UP 120 and DOWN 122 may be the phase detector outputs that cause the charge-pump to either add or subtract current to the output 70. Supply potential (Vdd) and reference potential (Vss), for example, ground, may be standard voltages to operate NMOS and PMOS. Current is added to the output 70 through PMOS 106 via inverter 109; and current is subtracted from the output 70 through NMOS 114 via inverter 118.

The signals UP 120 and DOWN 122 may constantly switch/change voltage. The switching may cause coupling or noise within nodes PBIAS 107 and NBIAS 116 through the source/gate capacitance of respective transistors 106, 114. The resultant noise may be unwanted charge injection.

To obtain matching currents through transistors 106, 114, the charge-pump includes replica or mirror charge-pump sub-circuits 65, 66 that may include mirror transistors 124, 126. The ratio of the size of PMOS 106 to PMOS 124 may equal the ratio of the size of NMOS 114 to NMOS 126. The mirror transistors 124, 126 may be in an on state as the source terminal of NMOS 126 communicates with Vdd through inverter 162. The source terminal of PMOS 124 may communicate with Vss through inverter 164.

A diode connected PMOS 176 that includes a gate that communicates with a drain communicates with drains of the mirror transistors 124, 126. PMOS 176 may communicate with current delivering transistors 124, 126 that may be symmetrically placed to cancel respective excess gate charge when the transistors 124, 126 are driven by complementary signals. When there is no change in voltage on node 178, the drain currents of the transistors 124, 126 may be identical. Consequently, the activation drain current of the PMOS 106 matches the activation drain current of NMOS 114, providing balanced charge-pump operation.

PMOS 124 may act as a current mirror for PMOS 106 so that if the current is increased to PMOS 124, that current may be mirrored to PMOS 106. Noise that is added to PBIAS 107 may increase current to PMOS 124. Therefore, an undesired amount of current may be added to output 70. Alternatively, noise that is added to NBIAS 116 may increase current to NMOS 126. NMOS 126 may act as a current mirror for NMOS 114 so that if the current is increased to NMOS 126, that current may be mirrored to NMOS 114. Therefore, an undesired amount of current may also be subtracted from the output 70. Undesirable current may cause jitter and/or other performance degradations in the PLL output frequency.

To overcome jitter and/or other performance degradations relatively large (for example, 5 pf) capacitances 130, 132 may be added across NBIAS 116, PBIAS 107 and Vss, Vdd respectively. The capacitances may stabilize voltage for high frequencies and may tend to discharge slowly and produce "shark fin" waveforms. Additional stray capacitances may "inject" charge into different parts of the circuit and may cause unpredictable transistor gate voltages that the capacitances 130, 132 may soak up. The capacitance value for the capacitances 132, 130 may be many times larger than the source-gate capacitance of PMOS 106 and the NMOS 114 to effectively attenuate ripple of the signals on PBIAS 107 and NBIAS 116.

To minimize size of the capacitances 130, 132, ripple reducing sub-circuits 67, 68 including, for example, PMOS and NMOS transistors 140, 142, may communicate with PBIAS 107 and NBIAS 116 respectively. Transistors 140, 142 may be symmetric versions of transistors 106, 114 and may cancel charge in PBIAS 107 and NBIAS 116 to reduce the value of the capacitances 130, 132 by a factor of 10 (for example, from 5 pf to 0.5 pf). In other words, charge-injection from PMOS 106 may then offset ripple in PBIAS 107 through PMOS 140. Jitter may be added to PMOS 140 rather than the node PBIAS 107. Further, charge-injection from NMOS 114 may offset ripple in NBIAS 116 through NMOS 142.

Transistors 114, 126, 142, 156 share a common gate voltage and transistors 106, 124, 140, 158 share a common gate voltage. Transistors 156, 126 receive source voltage Vdd through inverters 161, 162 respectively. Transistors 124, 158 communicate with Vss through inverters 164, 166 respectively. UP and DOWN signals 120, 122 are controlled through switching drivers, such as a first pair of inverters 167, 168 and a second pair of inverters 171, 172 respectively. NMOS 126 may be a diode connected transistor feeding into the gate of another NMOS 156 that provides the UP or DOWN current that pulls the voltage high or low. NMOS 126 translates current from the drain of NMOS 126 to the drain of NMOS 114.

A source of NMOS 142 receives the DOWN signal 122 through inverters 167, 154; and a source of PMOS 140 receives the UP signal 120 through inverters 171, 174. A source of NMOS 114 receives the inverted DOWN signal through inverters 167, 168, 118 and a source of PMOS 106 receives the inverted up signal through inverters 171, 172, 109. The invertors 167, 168, 171, 172 rapidly switch off the negative (DOWN) section as the positive (UP) section goes high and vice versa.

PBIAS 107 receives a bias voltage from a combination of a reference current source 144 that communicates with the PMOS 158 that may be diode connected having a gate that communicates with a drain. The current source 144 may be a transistor biased to be saturated. If PMOS 106 is "on" in response to a pump up signal, the transistor pair 124, 106 form a current mirror. Thus, the pump-up current may be a predetermined ratio of the current reference 144, dictated by the size ratio of the transistors 124, 106. All bias generating and/or mirror charge-pump and/or ripple reducing transistors may be sized larger relative to the size of transistors 106, 114.

The charge-pump may be implemented in a PLL circuit of a wireless network device. The wireless network device may be compliant with IEEE sections 802.11, 802.11a, 802.11b, 802.11g, 802.11n, 802.16, 802.20, and/or other existing or future wireless standards, which are hereby incorporated by reference in their entirety.

Figure 4B:
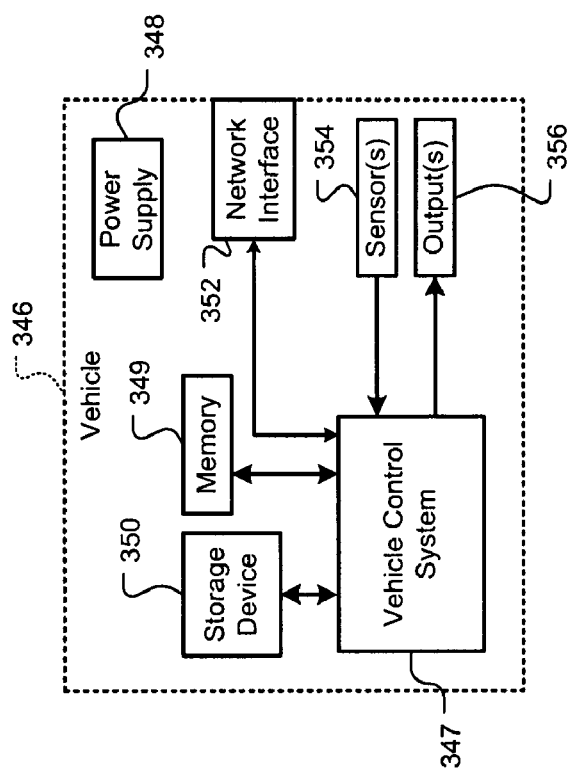
FIG. 4B is a functional block diagram of a vehicle control system.
Figure 4A:
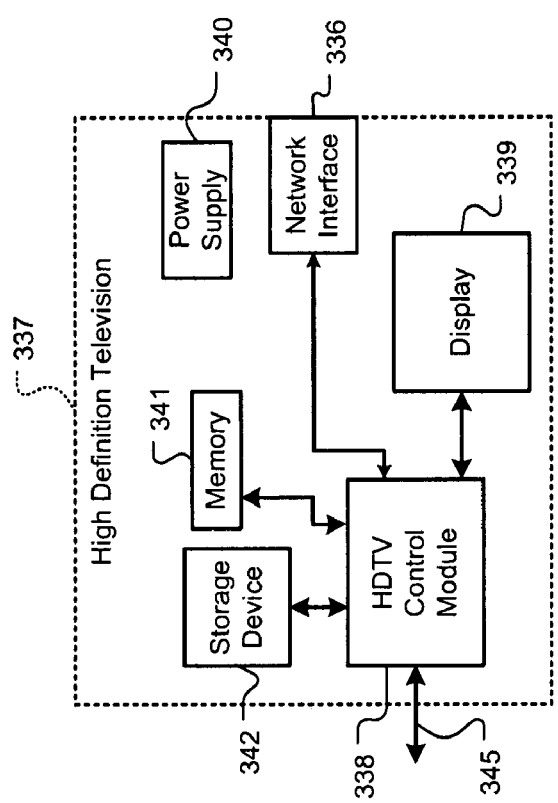
FIG. 4A is a functional block diagram of a high definition television.

Referring now to FIGS. 4A-4E, various exemplary implementations incorporating the teachings of the present disclosure are shown. Referring now to FIG. 4A, the teachings of the disclosure can be implemented in a network interface 336 of a high definition television (HDTV) 337. The HDTV 337 includes a HDTV control module 338, a display 339, a power supply 340, memory 341, a storage device 342, the network interface 336, and an external interface 345. If the network interface 336 includes a wireless local area network interface, an antenna (not shown) may be included.

The HDTV 337 can receive input signals from the network interface 336 and/or the external interface 345, which can send and receive information via cable, broadband Internet, and/or satellite. The HDTV control module 338 may process the input signals, including encoding, decoding, filtering, and/or formatting, and generate output signals. The output signals may be communicated to one or more of the display 339, memory 341, the storage device 342, the network interface 336, and the external interface 345.

Memory 341 may include random access memory (RAM) and/or nonvolatile memory such as flash memory, phase change memory, or multi-state memory, in which each memory cell has more than two states. The storage device 342 may include an optical storage drive, such as a DVD drive, and/or a hard disk drive (HDD). The HDTV control module 338 communicates externally via the network interface 336 and/or the external interface 345. The power supply 340 provides power to the components of the HDTV 337.

Referring now to FIG. 4B, the teachings of the disclosure may be implemented in a network interface 352 of a vehicle 346. The vehicle 346 may include a vehicle control system 347, a power supply 348, memory 349, a storage device 350, and the network interface 352. If the network interface 352 includes a wireless local area network interface, an antenna (not shown) may be included. The vehicle control system 347 may be a powertrain control system, a body control system, an entertainment control system, an anti-lock braking system (ABS), a navigation system, a telematics system, a lane departure system, an adaptive cruise control system, etc.

The vehicle control system 347 may communicate with one or more sensors 354 and generate one or more output signals 356. The sensors 354 may include temperature sensors, acceleration sensors, pressure sensors, rotational sensors, airflow sensors, etc. The output signals 356 may control engine operating parameters, transmission operating parameters, suspension parameters, etc.

The power supply 348 provides power to the components of the vehicle 346. The vehicle control system 347 may store data in memory 349 and/or the storage device 350. Memory 349 may include random access memory (RAM) and/or nonvolatile memory such as flash memory, phase change memory, or multi-state memory, in which each memory cell has more than two states. The storage device 350 may include an optical storage drive, such as a DVD drive, and/or a hard disk drive (HDD). The vehicle control system 347 may communicate externally using the network interface 352.

Figure 4D:
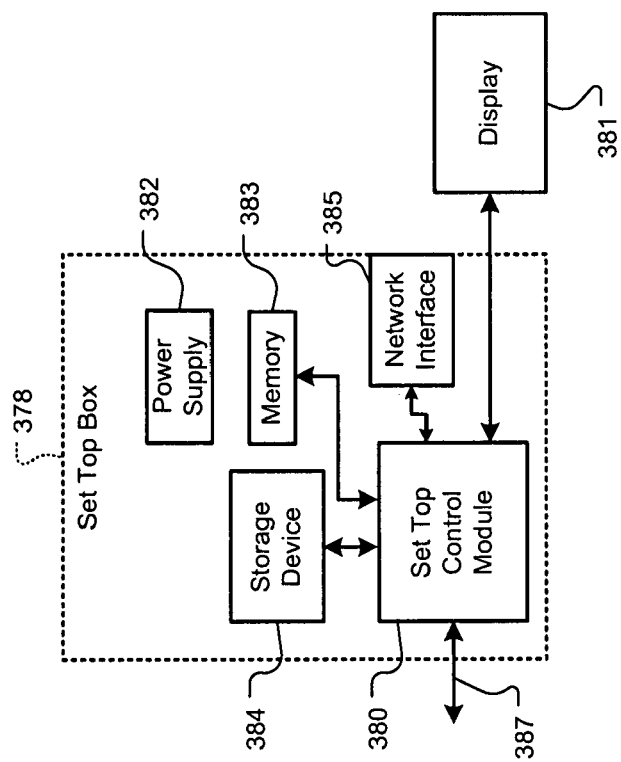
FIG. 4D is a functional block diagram of a set top box.
Figure 4C:
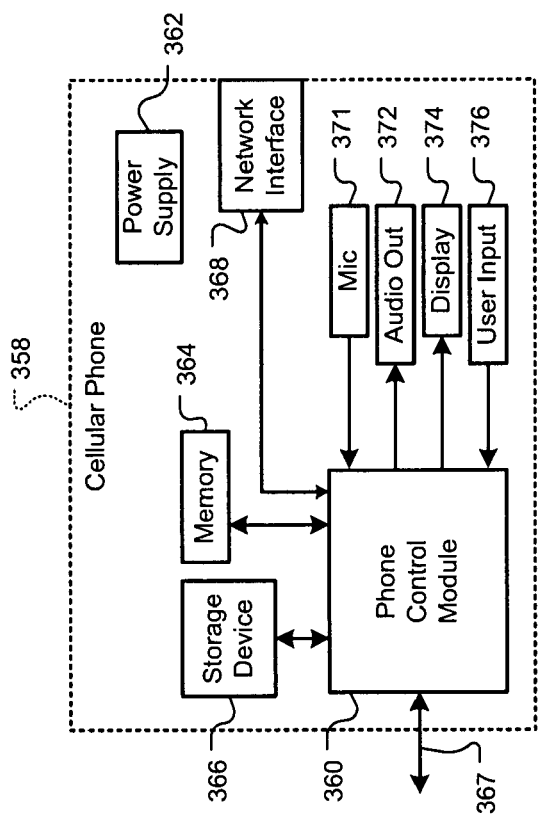
FIG. 4C is a functional block diagram of a cellular phone.

Referring now to FIG. 4C, the teachings of the disclosure can be implemented in a network interface 368 of a cellular phone 358. The cellular phone 358 includes a phone control module 360, a power supply 362, memory 364, a storage device 366, and a cellular network interface 367. The cellular phone 358 may include the network interface 368, a microphone 371, an audio output 372 such as a speaker and/or output jack, a display 374, and a user input device 376 such as a keypad and/or pointing device. If the network interface 368 includes a wireless local area network interface, an antenna (not shown) may be included.

The phone control module 360 may receive input signals from the cellular network interface 367, the network interface 368, the microphone 371, and/or the user input device 376. The phone control module 360 may process signals, including encoding, decoding, filtering, and/or formatting, and generate output signals. The output signals may be communicated to one or more of memory 364, the storage device 366, the cellular network interface 367, the network interface 368, and the audio output 372.

Memory 364 may include random access memory (RAM) and/or nonvolatile memory such as flash memory, phase change memory, or multi-state memory, in which each memory cell has more than two states. The storage device 366 may include an optical storage drive, such as a DVD drive, and/or a hard disk drive (HDD). The power supply 362 provides power to the components of the cellular phone 358.

Referring now to FIG. 4D, the teachings of the disclosure can be implemented in a network interface 385 of a set top box 378. The set top box 378 includes a set top control module 380, a display 381, a power supply 382, memory 383, a storage device 384, and the network interface 385. If the network interface 385 includes a wireless local area network interface, an antenna (not shown) may be included.

The set top control module 380 may receive input signals from the network interface 385 and an external interface 387, which can send and receive information via cable, broadband Internet, and/or satellite. The set top control module 380 may process signals, including encoding, decoding, filtering, and/or formatting, and generate output signals. The output signals may include audio and/or video signals in standard and/or high definition formats. The output signals may be communicated to the network interface 385 and/or to the display 381. The display 381 may include a television, a projector, and/or a monitor.

The power supply 382 provides power to the components of the set top box 378. Memory 383 may include random access memory (RAM) and/or nonvolatile memory such as flash memory, phase change memory, or multi-state memory, in which each memory cell has more than two states. The storage device 384 may include an optical storage drive, such as a DVD drive, and/or a hard disk drive (HDD).

Figure 4E:
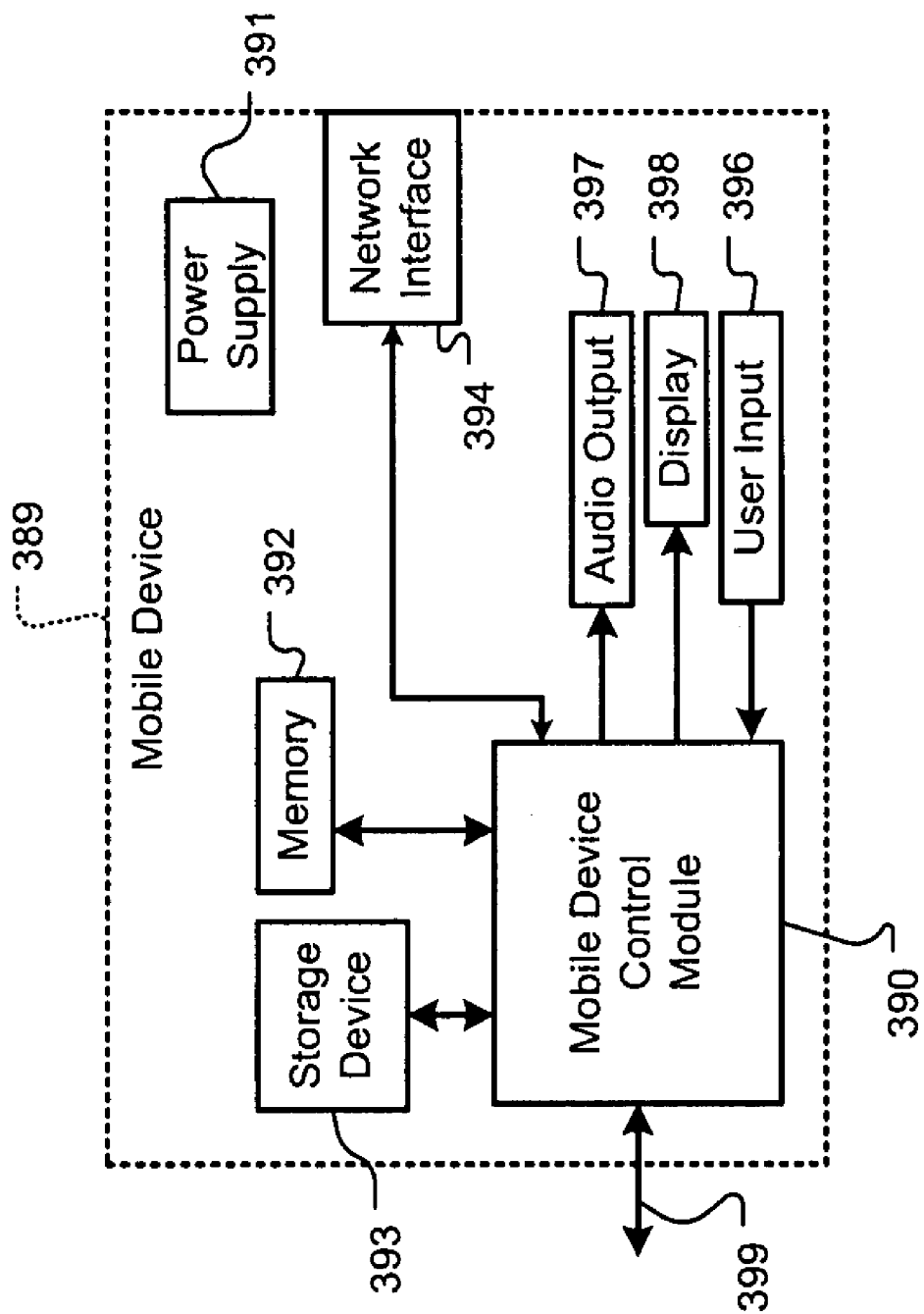
FIG. 4E is a functional block diagram of a mobile device.

Referring now to FIG. 4E, the teachings of the disclosure can be implemented in a network interface 394 of a mobile device 389. The mobile device 389 may include a mobile device control module 390, a power supply 391, memory 392, a storage device 393, the network interface 394, and an external interface 399. If the network interface 394 includes a wireless local area network interface, an antenna (not shown) may be included.

The mobile device control module 390 may receive input signals from the network interface 394 and/or the external interface 399. The external interface 399 may include USB, infrared, and/or Ethernet. The input signals may include compressed audio and/or video, and may be compliant with the MP3 format. Additionally, the mobile device control module 390 may receive input from a user input 396 such as a keypad, touchpad, or individual buttons. The mobile device control module 390 may process input signals, including encoding, decoding, filtering, and/or formatting, and generate output signals.

The mobile device control module 390 may output audio signals to an audio output 397 and video signals to a display 398. The audio output 397 may include a speaker and/or an output jack. The display 398 may present a graphical user interface, which may include menus, icons, etc. The power supply 391 provides power to the components of the mobile device 389. Memory 392 may include random access memory (RAM) and/or nonvolatile memory such as flash memory, phase change memory, or multi-state memory, in which each memory cell has more than two states. The storage device 393 may include an optical storage drive, such as a DVD drive, and/or a hard disk drive (HDD). The mobile device may include a personal digital assistant, a media player, a laptop computer, a gaming console, or other mobile computing device.

Those skilled in the art can now appreciate from the foregoing description that the broad teachings of the disclosure can be implemented in a variety of forms. Therefore, while this disclosure includes particular examples, the true scope of the disclosure should not be so limited since other modifications will become apparent to the skilled practitioner upon a study of the drawings, the specification and the following claims.

What is claimed is:

1. A charge-pump comprising:
    a first switching driver that outputs a first signal and a first inverted signal based on a first control signal;
    a second switching driver that outputs a second signal based on a second control signal;
    a first transistor of a first type comprising a control terminal that communicates with a first voltage bias line, a first terminal, and a second terminal that receives said first signal;
    a second transistor of said first type comprising a control terminal that communicates with said control terminal of said first transistor of said first type, a first terminal, and a second terminal that receives said first inverted signal; and
    a first transistor of a second type comprising a first terminal that communicates with said first terminal of said first transistor of said first type, a control terminal that communicates with a second voltage bias line, and a second terminal that receives said second signal.

2. The charge-pump of claim 1 wherein said control terminal of said first transistor of said first type comprises a gate, wherein said first terminal of said first transistor of said first type comprises a drain, and wherein said second terminal of said first transistor of said first type comprises a source.

3. The charge-pump of claim 1 further comprising an output that communicates with said first terminals of said first transistor of said first type and said first transistor of said second type.

4. The charge-pump of claim 1 wherein said second switching driver outputs a second inverted signal and the charge pump further comprising a second transistor of said second type that comprises a control terminal that communicates with said control terminal of said first transistor of said second type, a first terminal, and a second terminal that receives said second inverted signal.

5. The charge-pump of claim 1 wherein said first signal comprises an up signal and said second signal comprises a down signal.

6. The charge-pump of claim 1 wherein one of said first type and said second type comprises a p-channel metal-oxide semiconductor (PMOS) and the other of said first type and said second type comprises an n-channel metal-oxide semiconductor (NMOS).

7. The charge-pump of claim 1 further comprising:
a first capacitance that communicates with said first bias voltage line; and
a second capacitance that communicates with said second bias voltage line.

8. The charge-pump of claim 1 further comprising a reference current source comprising a first terminal that communicates with said first voltage bias line; and
a first diode-connected transistor comprising a first terminal that communicates with said first terminal of said current reference source, a second terminal, and a control terminal that communicates with said first terminal and said first voltage bias line.

9. The charge-pump of claim 8 further comprising a mirror charge-pump sub-circuit that comprises:
a second diode-connected transistor;
a third transistor of said first type comprising a control terminal that communicates with said first voltage bias line, a first terminal that communicates with a second terminal of said second diode-connected transistor, and a second terminal that communicates with at least one of a supply potential and a reference potential; and
a third transistor of said second type comprising a control terminal that communicates with said second bias line, a first terminal that communicates with a first terminal of said second diode-connected transistor, and a second terminal that communicates with at least one of said supply potential and said reference potential.

10. The charge-pump of claim 1 wherein said second transistor of said first type attenuates ripple on said first bias voltage line during charge-pump switching.

11. A phase-locked loop (PLL) that comprises the charge-pump of claim 1.

12. The PLL of claim 11 further comprising:
a voltage controlled oscillator (VCO);
a frequency divider receives an output of said VCO; and
a phase detector that detects a phase difference between a reference frequency signal and an output of said frequency divider, and that generates said first and second control signals.

13. The PLL of claim 12 wherein the charge-pump generates an output signal that adjusts an output signal of said VCO.

14. A charge-pump comprising:
a first switching driver that is responsive to an up control signal and that outputs a first signal and a first inverted signal;
a second switching driver that is responsive to a down control signal and that outputs a second signal and a second inverted signal;
a first transistor of a first type that comprises a gate that communicates with a first voltage bias line, a drain, and a source that receives said first signal;
a second transistor of said first type that comprises a gate that communicates with said gate of said first transistor of said first type, a drain, and a source that receives said first inverted signal;
a first transistor of a second type that comprises a drain that communicates with said drain of said first transistor of said first type, a gate that communicates with a second voltage bias line, and a source that receives said second signal;
a second transistor of said second type that comprises a gate that communicates with said gate of said first transistor of said second type, a drain, and a source that receives said second inverted signal; and
an output that communicates with said first transistor of said first type and said first transistor of said second type.

15. The charge-pump of claim 14 further comprising:
a first capacitance that communicates with said first bias voltage line; and
a second capacitance that communicates with said second bias voltage line.

16. A charge-pump comprising:
a first bias voltage line;
a first charge-pump sub-circuit having a control terminal that communicates with said first bias voltage line;
a first charge-pump mirror sub-circuit that regulates current on said control terminal;
a first capacitance that communicates with said first bias voltage line;
a first ripple reducing sub-circuit that communicates with said first bias voltage line;
a second bias voltage line;
a second charge-pump sub-circuit that communicates with said second bias voltage line;
a second charge-pump mirror sub-circuit that communicates with said second bias voltage line;
a second capacitance that communicates with said second bias voltage line;
a second ripple reducing sub-circuit that communicates with said second bias voltage line.

17. The charge pump of claim 16 further comprising an output that communicates with said first and second charge-pump sub-circuits.

18. A method for operating a charge-pump comprising:
outputting a first signal and a first inverted signal from a first switching driver based on a first control signal;
outputting a second signal from a second switching driver based on a second control signal;
communicating between a control terminal of a first transistor of a first type and a first voltage bias line, wherein said first transistor of said first type comprises a first terminal;
receiving said first signal in a second terminal of said first transistor of said first type;
communicating between a control terminal of a second transistor of said first type and said control terminal of said first transistor of said first type, wherein said second transistor of said first type comprises a first terminal;
receiving said first inverted signal in a second terminal of said second transistor of said first type;

communicating between a first terminal of a first transistor of a second type and said first terminal of said first transistor of said first type;

communicating between a control terminal of said first transistor of said second type and a second voltage bias line; and receiving said second signal in a second terminal of said first transistor of said second type.

19. The method of claim 18 wherein said control terminal of said first transistor of said first type comprises a gate, wherein said first terminal of said first transistor of said first type comprises a drain, and wherein said second terminal of said first transistor of said first type comprises a source.

20. The method of claim 18 further comprising communicating an output with said first terminals of said first transistor of said first type and said first transistor of said second type.

21. The method of claim 18 further comprising:

outputting a second inverted signal from said second switching driver;

communicating between a control terminal of a second transistor of said second type and said control terminal of said first transistor of said second type, wherein said second transistor of said second type comprises a first terminal; and receiving said second inverted signal in a second terminal of said second transistor of said second type.

22. The method of claim 18 wherein said first signal comprises an up signal and said second signal comprises a down signal.

23. The method of claim 18 wherein one of said first type and said second type comprises a p-channel metal-oxide semiconductor (PMOS) and the other of said first type and said second type comprises an n-channel metal-oxide semiconductor (NMOS).

24. The method of claim 18 further comprising:

communicating between a first capacitance and said first bias voltage line; and communicating between a second capacitance and said second bias voltage line.

25. The method of claim 18 further comprising:

communicating between a first terminal of a reference current source and said first voltage bias line;

communicating between a first terminal of a first diode-connected transistor and said first terminal of said current reference source, said first diode-connected transistor comprising a second terminal; and communicating between a control terminal of said first diode-connected transistor and said first terminal of said first diode-connected transistor and said first voltage bias line.

26. The method of claim 25 further comprising:

communicating between a control terminal of a third transistor of said first type and said first voltage bias line;

communicating between a first terminal of said third transistor of said first type and a second terminal of a second diode-connected transistor;

communicating between a second terminal of said third transistor of said first type and at least one of a supply potential and a reference potential;

communicating between a control terminal of a third transistor of said second type and said second bias line;

communicating between a first terminal of said third transistor of said second type and a first terminal of said second diode-connected transistor; and communicating between a second terminal of said third transistor of said second type and at least one of said supply potential and said reference potential.

27. The method of claim 18 further comprising attenuating ripple on said first bias voltage line during charge-pump switching with said second transistor of said first type.

28. A method for operating a charge-pump comprising:

outputting a first signal and a first inverted signal from a first switching driver in response to an up control signal;

outputting a second signal and a second inverted signal from a second switching driver in response to a down control signal;

communicating between a gate of a first transistor of a first type and a first voltage bias line, said first transistor of said first type comprising a drain;

receiving said first signal in a source of said transistor of said first type;

communicating between a gate of a second transistor of said first type and said gate of said first transistor of said first type, said second transistor of said first type also comprising a drain;

receiving said first inverted signal in a source of said second transistor of said first type;

communicating between a drain of a first transistor of a second type and said drain of said first transistor of said first type;

communicating between a gate of said first transistor of said second type and a second voltage bias line;

receiving said second signal in a source of said first transistor of said second type;

communicating between a gate of a second transistor of said second type and said gate of said first transistor of said second type, said second transistor of said second type also comprising a drain;

receiving said second inverted signal in a source of said second transistor of said second type; and communicating between an output, said first transistor of said first type, and said first transistor of said second type.

29. The method of claim 28 further comprising:

communicating between a first capacitance and said first bias voltage line; and communicating between a second capacitance and said second bias voltage line.

30. A method for operating a charge-pump comprising:

communicating between a control terminal of a first charge-pump sub-circuit and a first bias voltage line;

regulating current on said control terminal with a first charge-pump mirror sub-circuit;

communicating between a first capacitance and said first bias voltage line;

communicating between a first ripple reducing sub-circuit and said first bias voltage line;

communicating between a second charge-pump sub-circuit and a second bias voltage line;

communicating between a second charge-pump mirror sub-circuit and said second bias voltage line;

communicating between a second capacitance and said second bias voltage line; and communicating between a second ripple reducing sub-circuit and said second bias voltage line.

31. The method of claim 30 further comprising communicating between an output and said first and second charge-pump sub-circuits.

* * * * *